United States Patent [19]

Evans, Jr. et al.

[11] Patent Number: 5,926,412
[45] Date of Patent: Jul. 20, 1999

[54] FERROELECTRIC MEMORY STRUCTURE

[75] Inventors: Joseph T. Evans, Jr.; Jeff A. Bullington, both of Albuquerque, N.M.; Stephen E. Bernacki, Northboro, Mass.; Bruce G. Armstrong, Belmont, Calif.

[73] Assignee: Raytheon Company, Lexington, Mass.

[21] Appl. No.: 07/864,152

[22] Filed: Apr. 2, 1992

Related U.S. Application Data

[63] Continuation of application No. 07/479,495, Feb. 9, 1992, abandoned.

[51] Int. Cl.⁶ .................................................. G11C 11/22
[52] U.S. Cl. ........................ 365/145; 365/177; 365/225.6
[58] Field of Search ................................. 365/145, 177, 365/225.6

[56] References Cited

U.S. PATENT DOCUMENTS

| | | | |
|---|---|---|---|
| 2,773,250 | 12/1956 | Aigrain et al. | 365/145 |
| 2,876,436 | 3/1959 | Anderson | 365/145 |
| 3,585,611 | 6/1971 | Lefkowitz et al. | 365/145 |
| 3,728,694 | 4/1973 | Rohrer | 365/145 |
| 3,859,642 | 1/1975 | Mar | 365/145 |
| 3,939,292 | 2/1976 | Rohrer | 427/55 |
| 4,195,355 | 3/1980 | Rohrer | 365/145 |
| 4,707,897 | 11/1987 | Rohrer et al. | 29/25.42 |
| 4,713,157 | 12/1987 | McMillan et al. | 204/192.11 |
| 4,809,225 | 2/1989 | Dimmler et al. | 365/145 |
| 4,817,051 | 3/1989 | Chang | 365/225.6 |
| 4,858,183 | 8/1989 | Scharrer et al. | 365/177 |
| 4,860,254 | 8/1989 | Pott et al. | 365/145 |
| 4,873,664 | 10/1989 | Eaton, Jr. | 365/145 |
| 4,888,630 | 12/1989 | Paterson | 365/145 X |
| 4,933,899 | 6/1990 | Gibbs | 365/177 |
| 5,070,385 | 12/1991 | Evans, Jr. et al. | 365/145 X |
| 5,119,329 | 6/1992 | Evans, Jr. | 365/145 |

OTHER PUBLICATIONS

Parker et al, "Ferroelectric Materials for 64Mb and 256Mb DRAMs", IEEE Circuits & Devices, vol. 6, No. 1, Jan. 1990, pp. 17–26.

Fridkin, V. M., "Ferroelectric Semiconductors", Consultants Bureau, New York and London, 1980, pp. 299–303.

"Preparation of Pb (Zr,Ti)O₃ thin films by sol gel processing"; J. Appl. Phys. 64 (5); Sep. 1, 1988.

*Primary Examiner*—Jack A. Lane
*Attorney, Agent, or Firm*—Glenn H. Lenzen, Jr.; John W. Powell

[57] ABSTRACT

Architectures for a ferroelectric memory which avoids the half select phenomenon and the problems associated with destructive readout. Non-destructive readout is provided by measuring current through the ferroelectric memory as a measure of its resistance. Information is stored in the ferroelectric memory element by altering its resistance through a polarizing voltage. The half select phenomenon is avoided by using isolation techniques. In various embodiments, zener diodes or bipolar junction transistors are used for isolation.

7 Claims, 6 Drawing Sheets

FERROELECTRIC MEMORY STRUCTURE

This application is a continuation of application Ser. No. 479,495 filed Feb. 9, 1992 now abandoned.

BACKGROUND OF THE INVENTION

This application relates generally to non-volatile semiconductor memories and more specifically to ferroelectric memories.

Many types of semiconductor memories are known and extensively used in computerized systems. One type of memory, the non-volatile memory, fills a special role. Non-volatile memories retain information even if power to the system is lost.

Recently, ferroelectric material has been used to form non-volatile memories. Such memories are formed using thin film processing techniques to make arrays of capacitors with ferroelectric dielectrics. For example, the paper "Preparation of Pb(Zr,Ti)O$_3$ Thin Films by Sol Gel Processing", published in the Journal of Applied Physics, Volume 64(5), September 1988, describes the formation of a ferroelectric film denoted PZT. In the memory, the capacitors are connected to a grid of row and column control lines with one capacitor connected between each unique pair of a row and a column line. Each capacitor is one cell of the memory and stores one bit of information. This arrangement of cells forms what is commonly called a "cross-point array".

To store a bit of information in a cell, its corresponding row and column control lines are connected to a voltage source. The voltage polarizes the ferroelectric in the capacitor. A positive polarization represents a logic one. A negative polarization represents a logic zero.

To determine what is stored in a cell, a two-step destructive read operation is employed. In the first step, the contents of the cell are sensed. In the sense step, the cell is polarized positively and the displacement current flow into the cell is measured. If no displacement current flow is detected, the cell was previously positively polarized. Thus, no measured displacement current flow implies the cell stored a logic one. Conversely, if displacement current flow is detected, it is known the cell previously stored a logic zero.

After the sense step, the cell will always contain a logic one. If the cell previously stored a logic zero, a second step is required to restore this value. The value is restored by performing a write operation to write a logic zero in the cell.

The destructive readout crosspoint array suffers from several significant shortcomings. The first is called the "half select phenomenon". When a voltage is applied to the array to access one cell in the array, up to one half of that voltage may be dropped across other cells in the array. When a voltage is applied across a row line and a column line to access a cell, only one cell directly connects those two lines. However, there are other paths, called "parasitic paths", through the array which connect those particular row and column lines. These other paths contain more than one cell, which implies that less voltage is dropped across each cell in the parasitic paths. However, in some instances, the voltage across cells in the parasitic paths could be large enough to disturb the operation of those cells.

Heretofore, the half select phenomenon has been avoided by CMOS transistors used to isolate the ferroelectric capacitor in each cell. This approach suffers from two drawbacks. First, CMOS transistors are ill suited for carrying the relatively large amounts of currents needed to charge up the ferroelectric capacitor. The CMOS transistors must be made very large to carry the required current. However, dense memories are often desired and large transistors do not allow dense memories. Also, large CMOS transistors are likely to latch up. If large transistors are not used, the memory will operate slowly. Second, isolation transistors require separate control lines. These lines also take up a lot of space and are not compatible with dense memories.

A second shortcoming of destructive read out ferroelectric memories is that there is a period of time when information is not really in non-volatile memory. In particular, during a read operation, between the sense cycle and restore cycle, the information is not stored in the ferroelectric capacitor. If power to the circuit were lost at that instant, the information would be lost.

A third significant shortcoming of the destructive readout is called "fatigue". Applying a large voltage to the ferroelectric material stresses the material. Over time, the stressed material is less effective at storing charge. The voltage applied to the ferroelectric capacitor stresses the material. After numerous read or write operations, the cell becomes stressed and its performance as a memory becomes degraded. With destructive readout, the ferroelectric capacitor is stressed during writing as well as during the sense portion of the read and the restore portion of the read.

SUMMARY OF THE INVENTION

It is an object of this invention to provide a method of isolating the cells in a crosspoint array to avoid the half select phenomenon without using CMIOS isolation transistors.

It is also an object of this invention to provide a method of reading information stored in a ferroelectric memory without disrupting the information stored therein.

The foregoing and other objects are achieved in a crosspoint array of ferroelectric capacitors in which each capacitor is connected to its corresponding row and column control lines through zener diodes. The reverse breakdown voltage and the voltage applied to the array to read or write into one of the capacitors are appropriately selected. The reverse breakdown zener voltage is selected to be greater than one half the supply voltage so that the zener will not conduct as a result of the half select phenomenon voltage. The supply voltage must exceed the coercive threshold voltage of the ferroelectric capacitor at least by the reverse bias breakdown voltage of the zener diode to ensure that the capacitor is polarized when the cell is accessed.

According to another feature of the invention, the information stored in a cell is read by measuring the resistance of the ferroelectric capacitor. To measure resistance, a voltage less than the coercive threshold voltage is developed across the cell. The ohmic current flow is measured by a current sense amplifier.

In one embodiment, a bipolar junction transistor is connected between the ferroelectric capacitor and the current sense amplifier to act as a current preamplifier.

In yet another embodiment, the memory is configured such that two memory cells store one bit of information. The cells store complimentary values and their outputs are connected to a differential amplifier.

In another embodiment of the invention, the ferroelectric capacitor of each cell is isolated by bipolar transistors. The bases of all the transistors in the cells of one row of the crosspoint array are connected to a word control line.

In yet a further embodiment, a pair of ferroelectric capacitors is connected to a static RAM cell through bi-polar isolation transistors. This embodiment can be further modified to allow for resistive readout.

BRIEF DESCRIPTION OF THE DRAWINGS

The invention may be better understood by reference to the following detailed description and accompanying drawings in which.

DESCRIPTION OF THE PREFERRED EMBODIMENTS

Figure 1A:
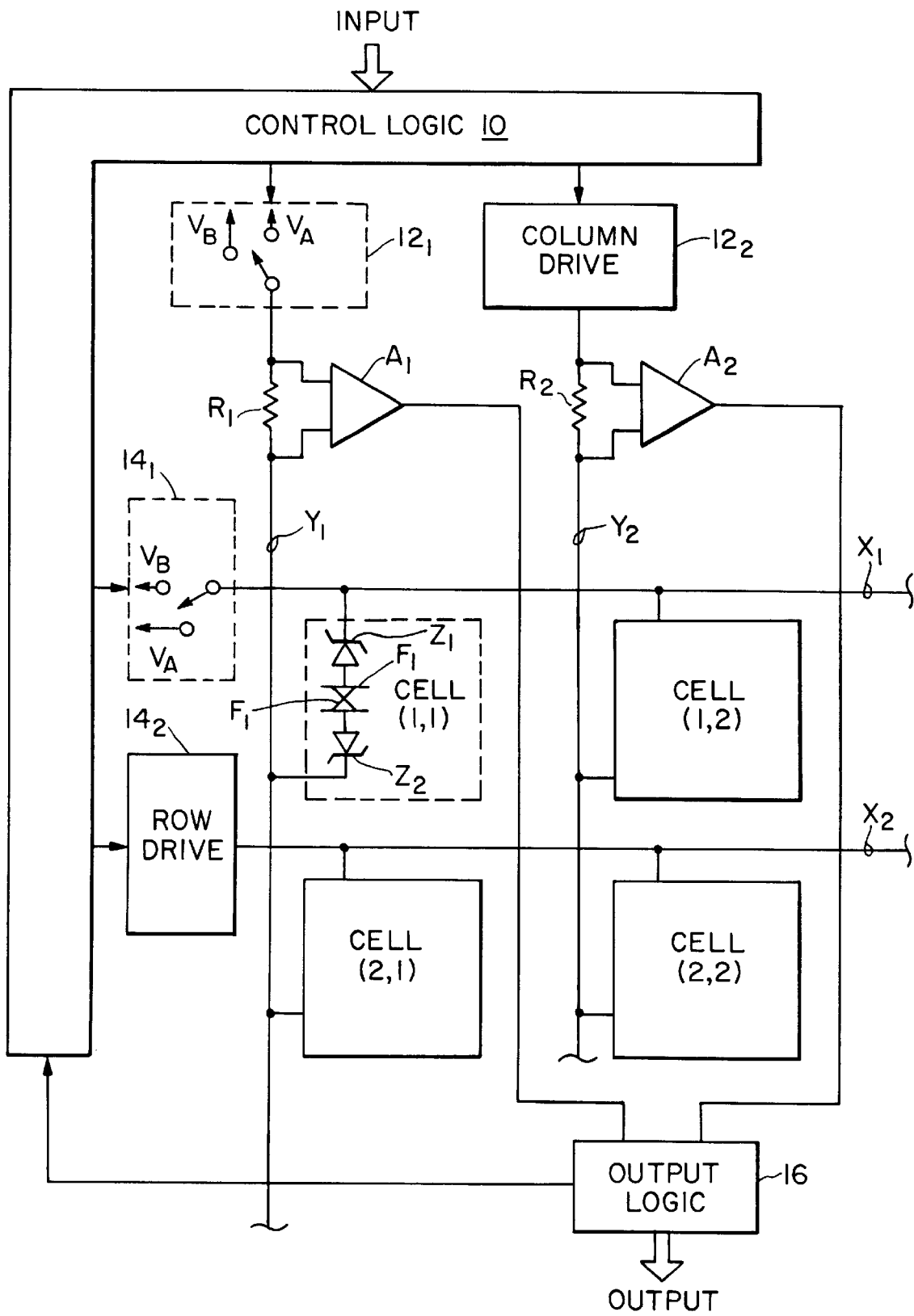
FIG. 1A shows a simplified schematic of one embodiment of the invention.

FIG. 1A shows a block diagram of one embodiment of a memory made according to the invention. In this embodiment, the hall select phenomenon is avoided by zener diode isolation. The blocks shown in FIG. 1A represent circuits which one of skill in the art will understand how to make as part of a semiconductor integrated circuit. Here, an array of four memory cells—cell (1, 1), cell (1, 2), cell (2, 1), and cell (2, 2)—is shown. One of skill in the art will appreciate a semiconductor memory would likely have many more cells.

The cells are connected to row lines $X_1$ and $X_2$ and column $Y_1$ and $Y_2$ to form a crosspoint array. The voltages needed to read and write to the cells are applied to column lines $Y_1$ and $Y_2$ by column drivers $12_1$ and $12_2$ and to row lines $X_1$ and $X_2$ by row drivers $14_1$ and $14_2$. The value of voltage to be applied to each row and column line is dictated by control logic 10. Control logic 10 receives inputs which indicate whether a read or write operation is to be performed and which cell to operate on. In response, control logic 10 applies signals to column drivers $12_1$ and $12_2$ and row drivers $14_1$ and $14_1$.

The operation of the memory cell can be better understood by reference to the details shown for cell (1, 1). Cell (1, 1) is typical of all the cells in the array. The cell contains ferroelectric capacitor $F_1$. To form the capacitor, a layer of metal is deposited over the semiconductor material from which the memory is formed. Next, a layer of ferroelectric, such as PZT is deposited over the metal. Finally, a second layer of metal is deposited over the ferroelectric. These layers may be deposited and patterned using known techniques.

As shown, one side of ferroelectric capacitor $F_1$ is connected through zener diode $Z_1$ to row line $X_1$ and the other side is connected to column line $Y_1$ via zener diode $Z_2$.

The zener breakdown voltage of zener diodes $Z_1$ and $Z_2$ are selected so that the cells do not suffer from the half select phenomenon. The zener breakdown voltage of zener diodes $Z_1$ and $Z_2$ is larger than one-half of the supply voltage. As described previously, the half select phenomenon can cause up to one-half of the supply voltage to appear across a cell even if that cell is not being accessed. With zener diodes $Z_1$ and $Z_2$ in series as shown, a voltage of one-half the supply voltage will be insufficient to break down one of she diodes. Thus, one zener diode one will be in a non-conducting state and no voltage will be applied to ferrielectric capacitor $F_1$ unless the cell is accessed.

However, wvhen cell (1, 1) is to be acessed, tie voltage across the cell is approximately equal to the supply voltage. Regardless of which polarity is applied to the cell, one of the zener diodes $Z_1$ or $Z_2$ will be forward biased having a voltage drop of approximately 0.5 V and the other zener diode will be in reverse bias breakdown having a voltage drop of approximately one half of the supply voltage. The remaining voltage—roughly one half of the supply voltage—is dropped across ferroelectric capacitor $F_1$. The supply voltage is chosen to be large enough that one-half of the supply voltage will polarize ferroelectric capacitor $F_1$. The voltage needed to polarize ferroelectric capacitor $F_1$ is often called the "coercive voltage". Thus, the supply voltage must exceed twice the coercive voltage.

To write a logic one into cell (1, 1), row driver $14_1$ is switched so that voltage $V_A$ is coupled onto row line $X_1$. Column driver 12 couples voltage $V_B$ onto column line $Y_1$. Voltages $V_A$ and $V_B$ differ by the supply voltage $V_s$. For example, $V_A$ could equal $V_s$ and $V_B$ could be ground potential. Alternatively, $V_A$ could be $+V_s/2$ and $V_B$ could be $-V_s/2$.

Conversely, to write a logic zero into cell (1, 1), row line $X_1$ is at voltage $V_B$ and column line $Y_1$ is at voltage $V_A$. Thus, the polarity of the voltage across ferroelectric capacitor $F_1$ is inverted.

To read what is stored in cell (1, 1), a destructive readout performed. During the sense portion of the read, row line $X_1$ is connected to $V_A$ ants column line $Y_1$ i is connected to $V_B$. A logic one is written into the cell. However, if displacement current had to flow to write a logic one into the cell, the output of sense amp $A_1$ will indicate it. Here, $A_1$ is shown schematically as a differential voltage amplifier connected across a resistor $R_1$. However, any known method of measuring current could be used. For example, a current integrating amplifier could also be used.

If displacement current flowed to write a logic one into cell (1, 1), the cell previously stored a logic zero. In this way, the output of amplifier $A_1$ can indicate what was stored in cell (1, 1) before the sense portion of the read. The output of amplifier $A_1$ is coupled to output logic 16. Output logic 16 provides the value stored in the cell to control logic 10. If cell (1, 1) previously stored a logic zero, control logic 10 will cause a logic zero to be written into the cell. Output logic 10 also formats the information to be output from the memory. For example, the output might need to appear at a particular time or in conjunction with other signals. Output logic 16 operates similarly to output logic for other known memories.

Figure 1B:
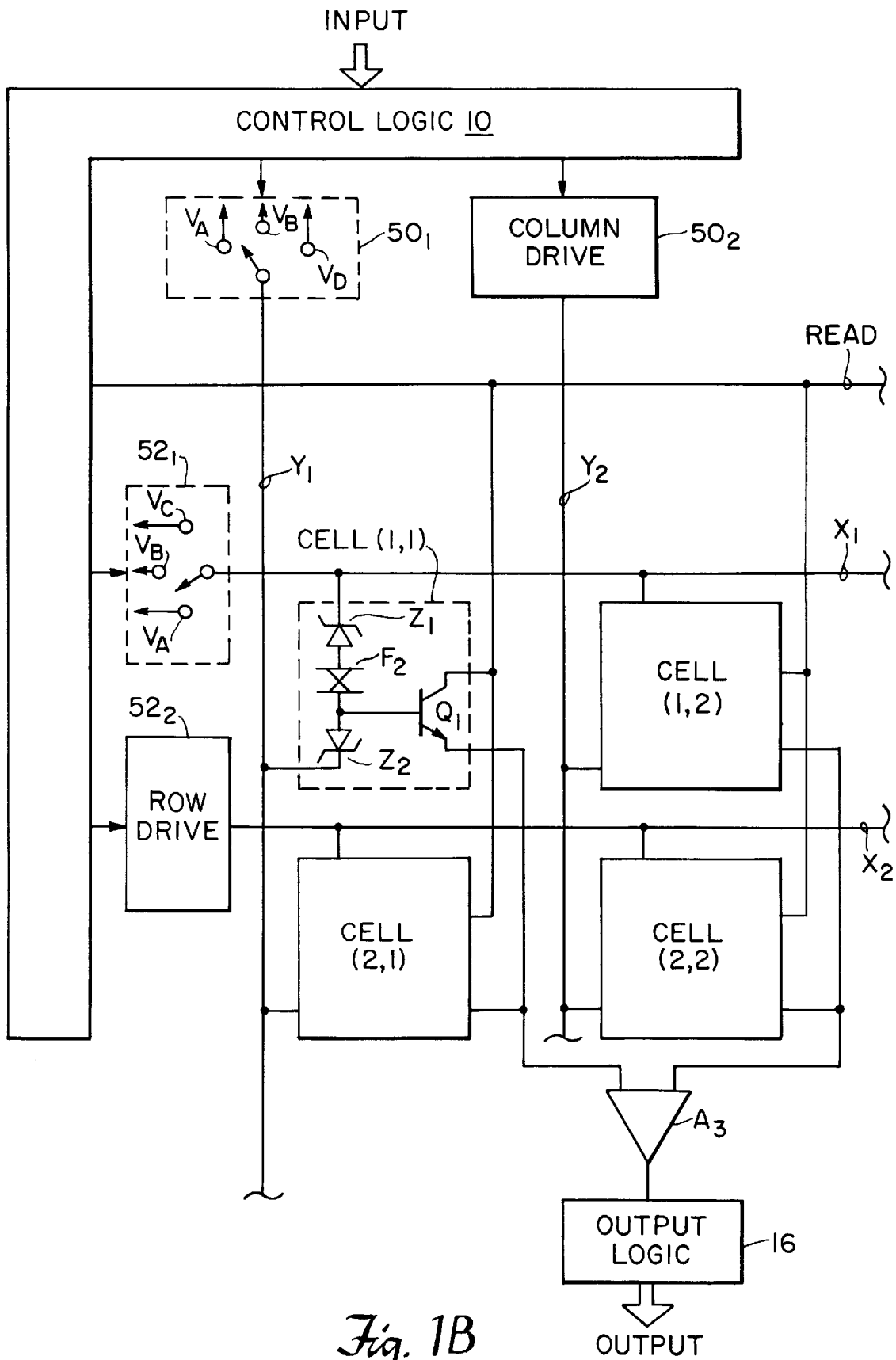
FIG. 1B shows a simplified schematic of the embodiment of the invention in FIG. 1A adapted to operate with a non-destructive readout.

FIG. 1B shows a variation to the memory of FIG. 1A, which is called "resistive readout" or "nonrestrictive readout". The memory contains zener diodes $Z_1$ and $Z_2$ to eliminate the half select phenomenon. Information is written to the cell as described in connection with FIG. 1A. The difference between the memories of FIG. 1A and FIG. 1B is in the way information is read from the cell.

The read operation makes use of the property of ferroelectric material that its resistance depends on its polarization polarity. As described previously, the polarization polarity of ferroelectric cell $F_2$ depends on whether it stores a logic one or a logic zero. Thus, sensing the resistance of ferroelectric capacitor $F_2$ indicates the information stored in the cell.

To sense the resistance of ferroelectric capacitor $F_2$, row driver $52_1$ connects row line $X_1$ to voltage $V_C$. Column line $Y_1$ is connected to voltage source $V_D$. Voltage $V_D$ ensures that the cathode of zener diode $Z_2$ is at a voltage higher than the base of transistor $Q_1$. This voltage ensures zener diode $Z_2$ is reverse biased and does not conduct. Voltage $V_C$ is large enough that zener diode $Z_1$ is in reverse bias breakdown and a small voltage—say 50 to 100 millivolts—is dropped across ferroelectric capacitor $F_2$.

Ferroelectric capacitor $F_2$ has a large resistance, but the voltage across it will cause a small "ohmic current" flow, which is proportional to the resistance. Since zener diode $Z_2$ is reverted biased, the whole current will flow into the base of transistor $Q_1$ Transistor $Q_1$ acts as a current preamplifier as long as the control line READ is at a high enough voltage to bias transistor $Q_1$ into its forward operating region.

The amplified current is applied as an input to amplifier $A_3$. An ohmic current above a predetermined threshold into amplifier $A_3$ signifies that ferroelectric capacitor $F_2$ has a resistance consistent with a polarization state which indicates a logic one. Conversely, a current below a predetermined threshold indicates ferroelectric capacitor $F_2$ has a resistance consistent with a polarization state which indicates a logic zero.

It should be noted that the cell of FIG. 1B is read without changing the polarization of cell $F_2$. The voltage applied across ferroelectric cell $F_2$ during a read operation is on the order of one-tenth of a volt. A voltage on the order of several volts is traditionally needed to affect the polarization state of a ferroelectric capacitor in a semiconductor structure.

The low voltage across ferroelectric capacitor $F_2$ during the read poses a difficulty because the resulting current flow is so small. For example, currents are typically on the order of 0.001 nanoAmps in one polarization state and 0.1 nanoAmps in the opposite polarization state. While the currents in these two states differ by two orders of magnitude, the magnitudes of these currents is still very small. Measurement of these currents could be unreliable, especially in the presence of noise. Several steps can be taken to ensure accurate measurement of these small currents.

One technique to improve measurement of small currents is the inclusion of transistor $Q_1$ as a current preamplifier. If lower resistance ferroelectrics are developed, transistor $Q_1$ might be eliminated.

A second technique shown in FIG. 1B for improving the accuracy of current measurement is the use of a differential amplifier for amplifier $A_3$. As shown, the outputs of cells (1, 1) and (2, 1) in the first column feed one input of amplifier $A_3$. Outputs of cells (1, 2) and (2, 2) in the second column feed the second input of amplifier $A_3$. If the memory is operated so that cells (1, 2) and (2, 2) always store the logical compliment of the values in cells (1, 1) and (1, 2), respectively, a differential input will be applied to amplifier $A_3$. It should be noted that two cells are thus needed to store one bit of information if a differential amplifier is used for amplifier $A_3$. It should also be noted that for the control lines shown in FIG. 1B, all the cells in one row of the array will produce an output when any cell in the row is accessed. However, such an arrangement is commonly used in conventional memories and can easily be compensated for by output logic 16.

Another technique to measurement of the resistance of ferroelectric capacitor $F_2$ through ohmic current measurement relates to decreasing the resistance of the capacitor. The ohmic current flow increases with a lower resistance, making the measurement less susceptible to noise.

One way to reduce the resistance of ferroelectric capacitor $F_2$ is to reduce the potential barrier where the metal plates of the capacitor contact the ferroelectric dielectric. To reduce the potential barrier, the metal used to form the plates should have a work function similar to that of the ferroelectric. For PZT ferroelectrics, a conductive oxide is used. Tin-Oxide, indium-tin-oxide or nickel-oxide could be used. Such materials can result in a resistance for the capacitor of $10^8$ ohms-cm as opposed to $10^{12}$ ohms-cm found if the capacitor is formed with traditional formed contact metals. It is known in the art how to form conductive layers of such materials by sputtering or sol-gel deposition techniques.

A second way to reduce the resistance across the ferroelectric capacitor $F_2$ is to reduce the bulk resistance of the ferroelectric. The resistance can be reduced in several ways. One way is to include an inert metal into the PZT gel before it is spun out into a layer. Small amounts of silver, lead, or platinum could be used as a dopant. These dopants could be sputtered onto the surface and thee diffused into the PZT film. Additionally, excess lead, zirconium, or titanium could be introduced into the sol-gel before it is spun into film. Materials which are known as p-type dopants for semiconductors, such as boron or gallium, could also be introduced into the ferroelectric to lower its bulk resistance. Alternatively, the dielectric of capacitor $F_2$ could be made by alternatively depositing thin layers of PZT and thin layers of a metal. Another way to reduce the resistance would be through the inclusion of oxygen vacancies in the PZT film. Oxygen vacancies could be introduced by annealing the PZT film in a reducing atmosphere.

An alternative way to avoid the half select phenonenom is through the use of isolation transistors. To avoid some of the problems associated with CMOS isolation transistors of the prior art, FIG. 2A shows a scheme for using bipolar isolation transistors.

Figure 2A:
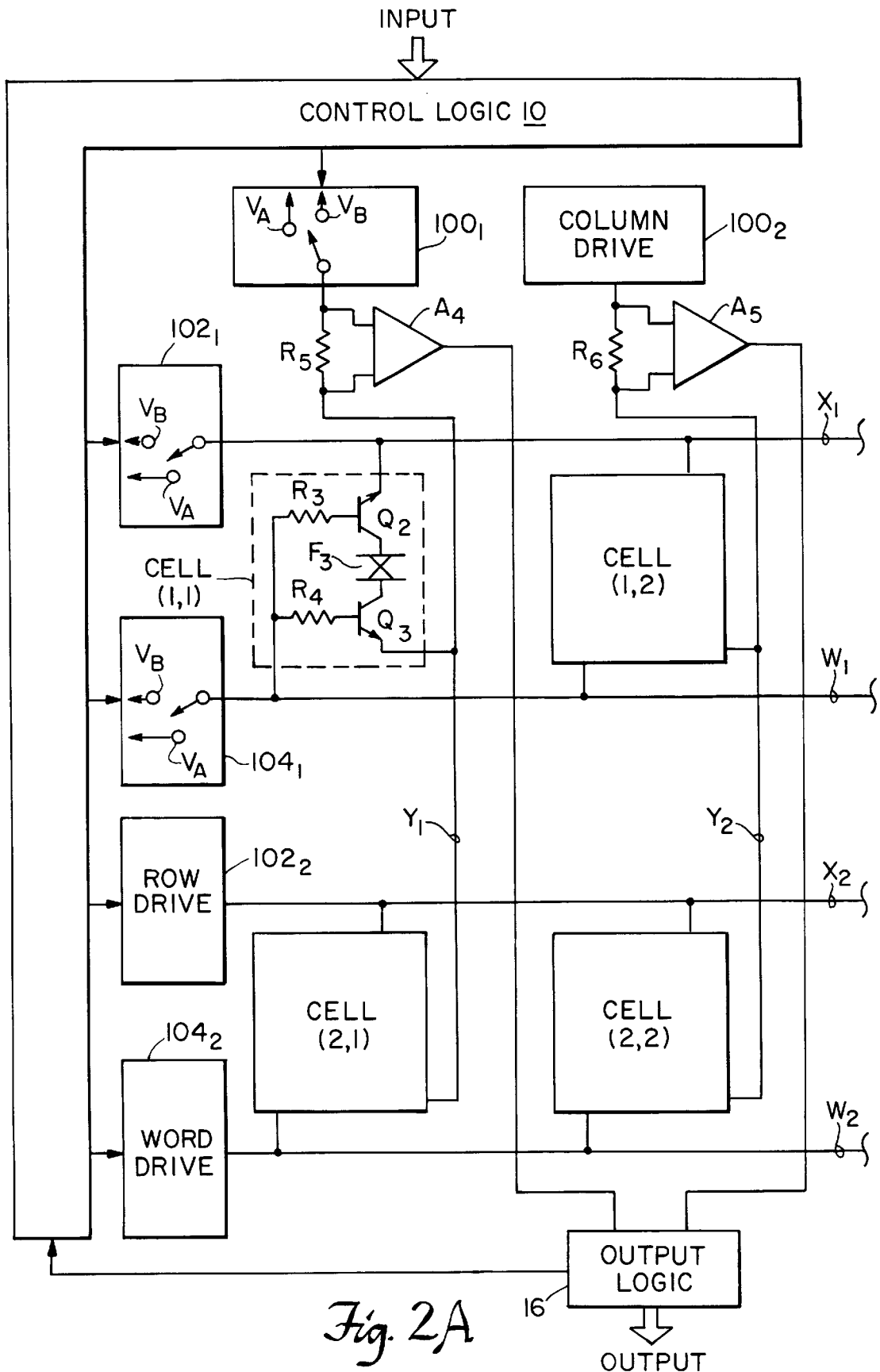
FIG. 2A shows a simplified schematic of an alternative embodiment of the invention.

FIG. 2A shows a four-bit crosspoint array of ferroelectric cells (1, 1) . . . (2, 2). Each cell is connected between one of the row control lines $X_1$ or $X_2$ and one of the column control lines $Y_1$ or $Y_2$. Additionally, each of the cells in each of the rows is connected to one of the word control lines $W_1$ or $W_2$. The row control lines, column control lines, and word control lines are connected to row drives $102_1$ or $102_2$, column drives $100_1$ or $100_2$, and word drives $104_1$ or $104_2$, respectively. The drives are controlled by control logic 10.

To write a logic one into the cell, row drive $102_1$ connects row line $X_1$ to voltage $V_A$ and column drive $100_1$ connects column line $Y_1$ to voltage $V_B$. To write a logic zero into cell (1, 1), the converse connections are made. Column $Y_1$ is connected to voltage $V_A$ and row line $X_1$ is connected to voltage $V_B$. Voltage $V_B$ is likely ground and voltage $V_A$ is near the supply voltage. Voltage $V_A$ exceeds the coercive voltage of ferroelectric capacitor $F_3$ by at least the amount of voltage dropped across transistors $Q_2$ and $Q_3$ when they are on.

Once the voltages on row line $X_1$ and column line $Y_1$ are set, the write is completed by connecting word line $W_1$ to voltage $V_A$. When no write is in process, word line $W_1$ is connected to voltage $V_B$ at ground potential.

When word line $W_1$ is connected to a high voltage, there will be a conducting path between a row line $X_1$ and column line $Y_1$. The path will encompass ferroelectric capacitor $F_3$ and transistors $Q_3$ and $Q_4$. One of the transistors $Q_3$ and $Q_4$ will conduct in the forward direction. The other will conduct in the reverse direction. Which transistor is conducting in the reverse direction depends on whether a logic one or a logic zero is being written to the cell. It is thus desirable for transistors $Q_3$ and $Q_4$ to have similar forward and reverse operating characteristics.

Resistors $R_3$ and $R_4$ are necessary to prevent word line $W_1$ from becoming "diode clamped" to row line $X_1$ or column line $Y_1$. The base to emitter voltages of transistors $Q_2$ and $Q_3$ is approximately 0.7 volts. Without resistors $R_3$ and $R_4$, word line $W_1$ would be only 0.7 volts above the lower voltage line—here that line is at ground potential. Resistors $R_3$ and $R_4$ should have a value on the order of 100,000 ohms.

To read the value stored in the cell, row line $X_1$, column line $Y_1$, and word line $W_1$ are operated as for writing a logic one into the cell. As described above in conjunction with FIG. 1A, the current flow into the cell is measured by the combination of resistor $R_5$ and amplifier $A_4$. The output of amplifier $A_4$ is provided to output logic 16. Output logic 16 provides the appropriate output and sends a signal to control logic 10 indicating whether a restore operation should be performed.

The memory of FIG. 2A has been described as if one cell were accessed at a time. The memory can also be used where one whole row of cells is accessed at one time. Control logic 10 and output logic 16, in that case, produce multiple control signals or receive multiple outputs. Memories which operate in this fashion are known in the art.

Figure 2B:
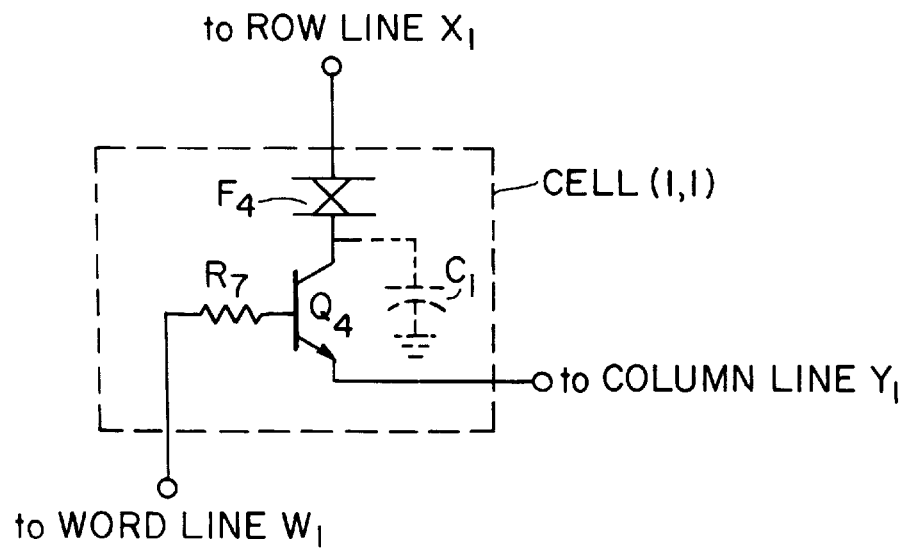
FIG. 2B shows a simplified schematic of an alternative embodiment of one cell of the memory of FIG. 2A.

FIG. 2B shows a simplified cell with only one isolation transistor $Q_4$. The cell of FIG. 2B is operated the same as the cell of FIG. 2A. With two isolation transistors as in FIG. 2A, no voltage is applied across ferroelectric capacitor $F_3$ as long as word line $W_1$ is at ground potential. In the cell of FIG. 2B, a small voltage appears across ferroelectric capacitor $F_4$. This voltage results because there is a parasitic capacitance between the collector of transistor $Q_4$ and ground. This capacitance is shown schematically as $C_1$. With a voltage on row line $X_1$, ferroelectric capacitor $F_4$ and capacitor $C_1$ form a capacitive voltage divider. However, as long as parasitic capacitance $C_1$ is kept small in comparison to ferroelectric capacitor $F_4$ by appropriate fabrication of transistor $Q_4$, the voltage across ferroelectric capacitor $F_4$ will be so small that it will not disrupt operation of ferroelectric capacitor $F_4$.

Figure 2C:
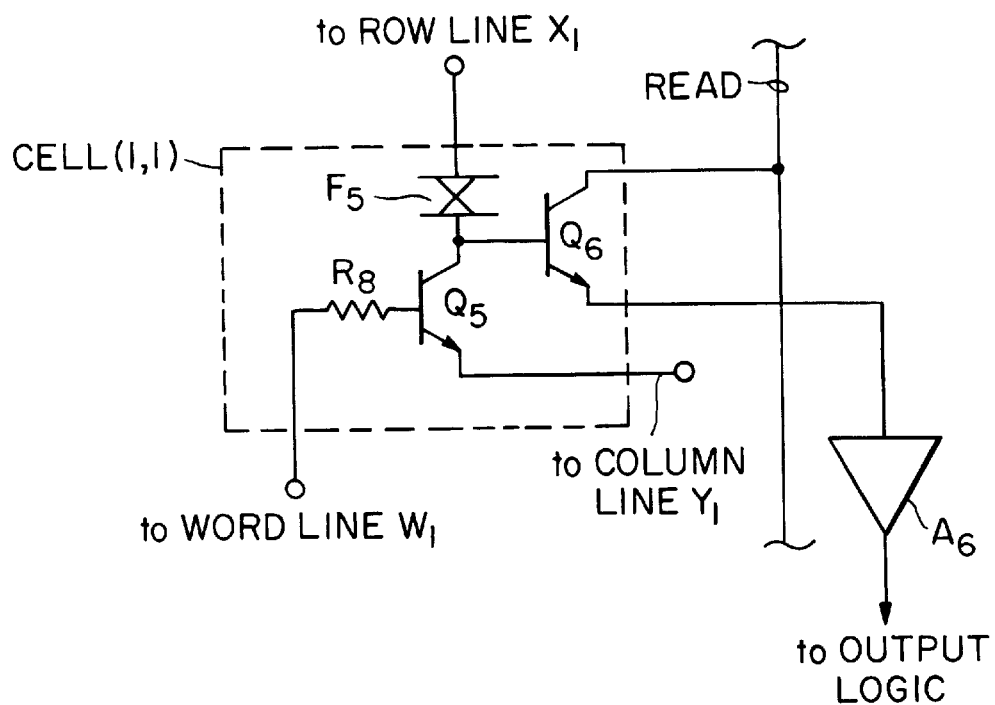
FIG. 2C shows an alternative embodiment of one cell of the memory of FIG. 2A.

The circuit of FIG. 2B can also be used to form a resistive readout memory. FIG. 2C shows the cell of FIG. 2B adapted with a preamplifier transistor $Q_6$. Transistor $Q_6$ operates like transistor $Q_1$ in FIG. 1B. Additionally, the cell is connected to a READ line, as are the cells in FIG. 1B. The emitter of transistor $Q_6$ is connected to sense amplifier $A_6$ in the same way that transistor $Q_1$ (FIG. 1B) is connected to amplifier $A_3$.

The cell of FIG. 2C is written in the same manner as the cell of FIG. 2B. To read the cell of FIG. 2C, word line $W_1$ is connected to ground potential. Row line $X_1$ is connected to a relatively small voltage—say one-tenth of a volt. The read line is connected to a positive voltage and the current through ferroelectric capacitor $F_5$ is measured in the same way that the current through ferroelectric capacitor $Q_1$ of FIG. 1B.

The method of isolation using bipolar junction transistors employed in the circuits of FIGS. 2A, 2B, and 2C can be employed in other memory structures.

Figure 3A:
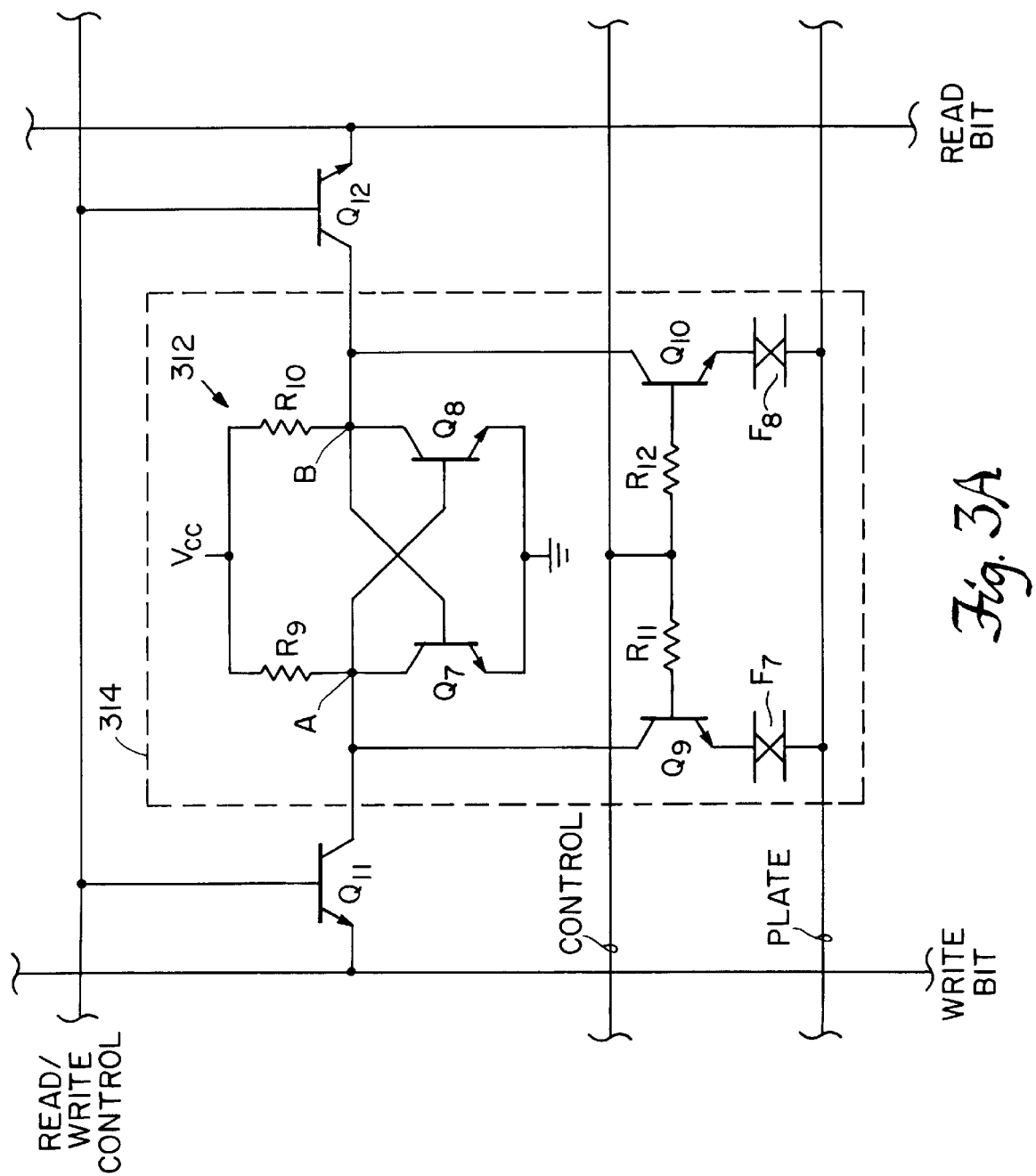
FIG. 3A shows an alternative embodiment of one memory cell.

FIG. 3A shows what is commonly termed a "shadow RAM". Transistors $Q_7$ and $Q_8$ and resistors $R_9$ and $R_{10}$ form what is called a static RAM cell or a flop-flop 312. Node A is always in the opposite logic state as Node B.

To read or write a bit into flip-flop 312, the WRITE/READ CONTROL line is placed in a logic high voltage state, turning on transistors $Q_{11}$ and $Q_{12}$. If the WRITE BIT line is connected to the positive supply, $V_{CC}$, a logic one is written into flip-flop 312. Conversely, if the WRITE BIT line is connected to ground, a logic zero is written into the cell. If the WRITE BIT line is "floating" (i.e., not connected to either $V_{CC}$ or ground), nothing is written into flip-flop 312 and it retains is value.

To read the value in flip-flop 312, the value on the READ BIT line is sensed. It should be noted that flip-flop 312 has a negative logic read out. In other words, if flip-flop 312 stores a logic one, the READ BIT line will have a low voltage on it.

Ferroelectric capacitors $F_7$ and $F_8$ in conjunction with transistors $Q_9$ and $Q_{10}$ and resistors $R_{11}$ and $R_{12}$ form the shadow portion of the memory. Ferroelectric capacitors $F_7$ and $F_8$ can be polarized to states which store the same information as in flip-flop 312. The states of ferroelectric capacitors $F_7$ and $F_8$ can also be transferred to flip-flop 312. In operation, the information stored in flip-flop 312 is transferred to ferroelectric capacitors $F_7$ and $F_3$ immediately before power to the memory is removed. When power is restored to the memory, the information in ferroelectric capacitors $F_7$ and $F_8$ is transferred back to flip-flop 312. In this way, information is retained in a memory even though power is turned off.

To transfer information to ferroelectric capacitors $F_7$ and $F_8$, the PLATE line is at a low voltage and the CONTROL line is at a high voltage. With the CONTROL line high, transistors $Q_9$ and $Q_{10}$ will conduct such that ferroelectric capacitor $F_7$ is effectively connected to node A and ferroelectric capacitor $F_8$ is effectively connected to node B. Either node A or node B will be at a logic high voltage. The first ferroelectric capacitor, the one connected to the node at a logic high voltage, will have a sufficient voltage across it to polarize the first ferro-electric capacitor in a positive direction. The second ferroelectric capacitor is not affected.

The second ferroelectric capacitor should be charged to the opposite polarity. This result is achieved by placing a high voltage on the PLATE line. The capacitor connected to the node at a low voltage will polarize opposite to the first capacitor. The first capacitor will have approximately zero volts across it, which is not enough to significantly alter its polarization.

Information may be transferred from the ferroelectric capacitors back to flip-flop 312 in several ways. One way is for flip-flop 312 to be disconnected from the positive supply $V_{CC}$. Next, the CONTROL line 13 is placed in a high voltage state, turning on transistors $Q_9$ and $Q_{10}$. A high voltage is placed on the PLATE line. Charge on ferroelectric capacitors $F_7$ and $F_8$ is shared with nodes A and B. The node corresponding to the ferroelectric capacitor with the positive polarization will acquire more charge than the other node. When flip-flop 312 is reconnected to $V_{CC}$, the node with the most charge will be latched into the high voltage state. The opposite node will be latched into the low voltage state. Thus, the state of flip-flop 312 is restored.

A similar approach can be followed at power up of the memory if CONTROL line is powered to a high voltage before the positive supply $V_{CC}$ supplies power to flip-flop 312.

It is important to note when using bipolar technology that capacitances are relatively small. For example, when charge is shared between ferroelectric capacitors $F_7$ and $F_8$ and nodes A and B, the switching to latch information into flip-flop 312 must occur quickly. Otherwise, the charge may dissipate before the switching occurs.

It is also important that once the state of ferroelectric cell is transferred to flip-flop 312, the information be rewritten to the ferroelectric capacitors $F_7$ and $F_8$. As described above, transferring the state of flip-flop 312 to ferroelectric capacitors $F_7$ and $F_8$ does not alter the state of flip-flop 312. However, transferring information from ferroelectric capacitors $F_7$ and $F_8$ may alter the state of the capacitors.

Figure 3B:
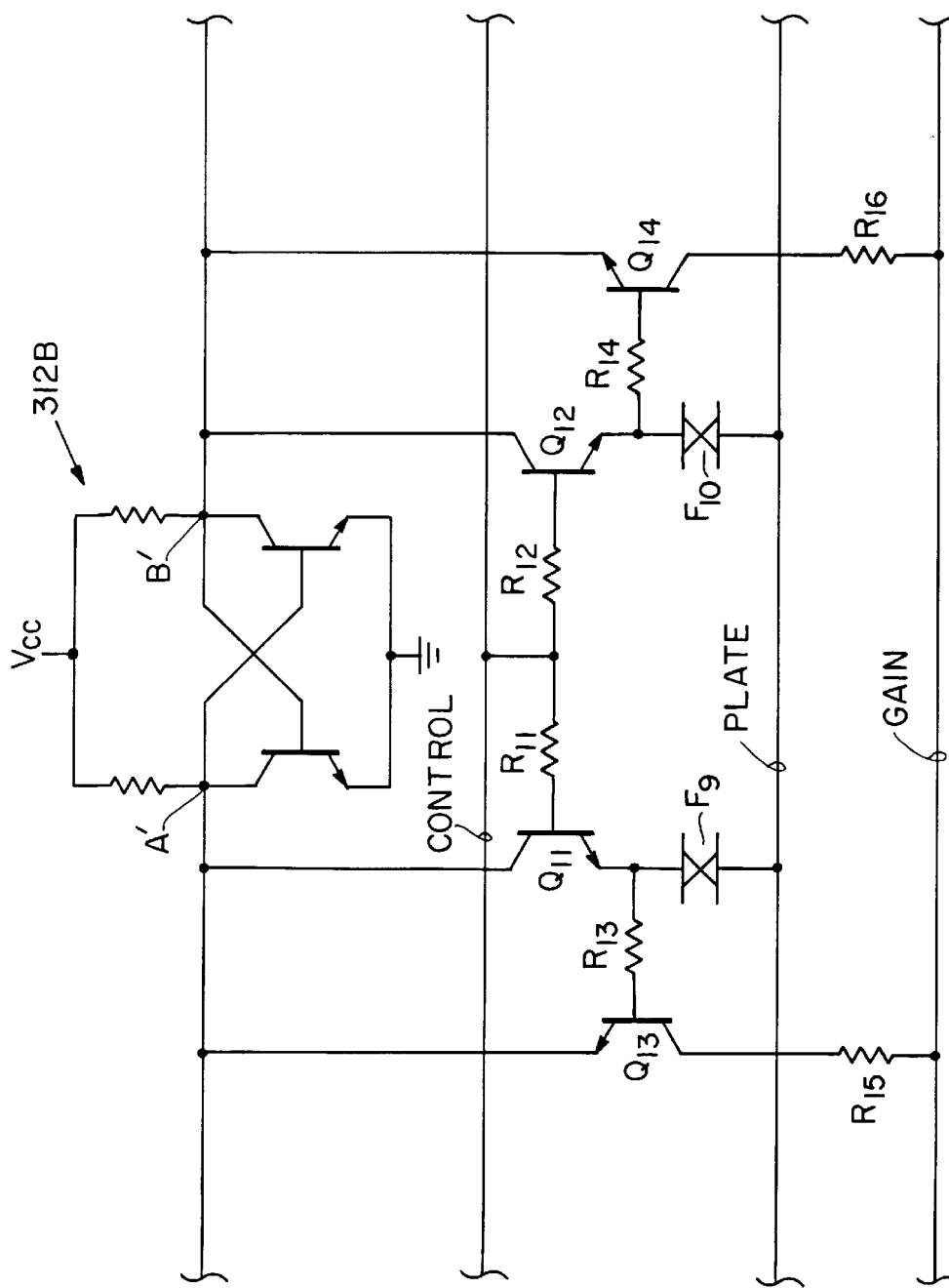
FIG. 3B shows the embodiment of FIG. 3A modified for non-destructive readout.

A similar arrangement may be used with the resistive readout ferroelectric capacitors. A shadow RAM cell 314B adapted for resistive readout is shown in FIG. 3B. Cell 314B contains a flip-flop 312B analogous to ferroelectric capacitors $F_7$ and $F_8$. Information is stored in flip-flop 312B in the same manner as described above. Likewise, the information is transferred from flip-flop 312B to ferroelectric capacitors $F_9$ and $F_{10}$ in the same manner as described above.

To transfer information from ferroelectric capacitors $F_9$ and $F_{10}$ to flip-flop 312B, resistive readout is used. The supply $V_{CC}$ to flip-flop 312B is disconnected. The CONTROL line is kept at a low voltage, the PLATE line is then raised to a voltage sufficient to drop a small voltage across ferroelectric capacitors $F_9$ and $F_{10}$. As described above, the current flow through the ferroelectric capacitors $F_9$ and $F_{10}$ will depend on their polarization state. That current flows through resistors $R_{13}$ and $R_{14}$ and is amplified in transistors $Q_{13}$ and $Q_{14}$ if the GAIN line is high. The current charges up nodes A' and B' with the node corresponding to the ferroelectric capacitor in the positive polarization state receiving more charge. Next, supply $V_{CC}$ is reconnected to flip-flop 312B. The supply voltage causes flip-flop 312B to latch. The node with more charge will be latched in the logic high state and the other node will be latched in the logic low state. Thus, the state of ferroelectric capacitors $F_9$ and and $F_{10}$ is transferred to flip-flop 312B.

Having described several embodiments of the invention, it will be apparent to one of skill in the art that numerous alternative embodiments could be made. Sensing the resistance of a ferroelectric capacitor to determine its polarization state could be used in many other memory architectures. As another example, the current through the ferroelectric element is measured for a constant applied voltage. One of skill in the art will appreciate that a constant current could be applied and the voltage measured. Also, many semiconductor fabrication techniques are known and could be used instead of any specific technique mentioned herein. It is felt, therefore, that this invention should be limited only by the spirit and scope of the appended claims.

What is claimed is:

1. A memory comprising:
    a logic state storage cell comprising a ferroelectric material having a coercive voltage;
    means for applying to the ferroelectric material a first voltage having a magnitude above the coercive voltage and a first polarity, such cell storing such first voltage as a first logic state and a second voltage having a magnitude above the coercive voltage and a second polarity opposite the first polarity of the first voltage, such cell storing such second voltage as a second logic state;
    means for reading the logic state stored in said cell by applying to the ferroelectric material a third voltage having a magnitude below the coercive voltage to provide a current flow through the ferroelectric material in response to the third voltage and for sensing the current flow provided through the ferroelectric material to detect the logic state stored in the cell; and
    said means for sensing current comprises a bipolar junction transistor having a base electrode connected to the ferroelectric material.

2. The memory of claim 1 wherein the means for sensing current additionally comprises an amplifier coupled to an emitter electrode of the bipolar junction transistor.

3. A memory comprising:
    a logic state storage cell comprising a ferroelectric material having a coercive voltage;
    means for applying to the ferroelectric material a first voltage having a magnitude above the coercive voltage and a first polarity, such cell storing such first voltage as a first logic state and a second voltage having a magnitude above the coercive voltage and a second polarity opposite the first polarity of the first voltage, such cell storing such second voltage as a second logic state;
    means for reading the logic state stored in said cell by applying to the ferroelectric material a third voltage having a magnitude below the coercive voltage to provide a current flow through the ferroelectric material in response to the third voltage and for sensing the current flow provided through the ferroelectric material to detect the logic state stored in the cell;
    a first and second zener diode, each diode having its anode connected to the cell;
    a row control line;
    a column control line wherein a cathode of the first zener diode is connected to the row control line and the cathode of the second zener diode is connected to the column control line; and
    said means for applying the first voltage and the second voltage comprises a row drive connected to the row control line and a column drive connected to the column control line wherein the first voltage is applied to the ferroelectric material when the column drive produces on the column line a voltage level $V_A$ and the row drive produces on the row line a voltage level $V_B$ with the difference between the voltage levels $V_A$ and $V_B$ exceeding the sum of the coercive voltage of the ferroelectric element, the forward bias voltage across the first zener diode.

4. The memory of claim 3 wherein the third voltage is applied to the ferroelectric element, with the column drive producing on the column line a voltage level $V_D$ and the row drive producing on the row line a voltage level $V_C$, with the voltage level $V_C$ being equal to the reverse breakdown voltage of the first zener diode plus 50 millivolts, and the voltage level $V_D$ being less than the reverse breakdown voltage of the second zener diode.

5. A ferroelectric memory comprising:
    a) a plurality of row control lines;
    b) a plurality of column control lines;
    c) a plurality of memory cells, each memory cell comprising a ferroelectric element comprising:
        a ferroelectric material having a coercive voltage characteristic; and
        a pair of electrodes with said ferroelectric material disposed between the pair of electrodes;
        a zener diode pair each diode having a first electrode and a second electrode with first like electrodes of said pair of diodes being coupled to the electrodes of said ferroelectric element and second like electrodes of said pair of diodes providing first and second terminals to the cell;
        a transistor having a control electrode coupled to the ferroelectric element and further having first and second electrodes; and wherein each one of said memory cells has the first terminal of the memory cell coupled to one of said plurality of row control lines and has the second terminal of the memory cell coupled to one of the plurality of column control lines; and a third conductor coupled to one of the first and second electrodes of the transistor; and a fourth conductor coupled to the other one of the electrodes of said transistor and to an output of the memory.

6. The memory, as recited in claim 5, further comprising:

a plurality of row drivers with each one of said row drivers adapted to provide one of a first set of three different voltages to a corresponding one of said row lines in response to a control signal fed to the row drivers;

a plurality of column drivers with each one of said column drivers adapted to provide one of a second set of three different voltages to a corresponding one of said column lines in response to a control signal fed to the column drivers;

wherein the third conductor provides a voltage to each one of said transistors to bias a selected one of said transistors of a selected corresponding one of said cells into a forward operating region of the transistor in accordance with the voltages fed on said row lines and said column lines.

7. The memory, as recited in claim 6, wherein in response to voltages on row and column lines fed to the selected one of said transistor of said selected one of said corresponding cells, a first one of said diodes of said selected one of said corresponding cells is placed in a reverse biased state, the second one of the said diodes of the selected one of said corresponding cells is replaced in a reverse biased breakdown state, and a small voltage in the range of 50–100 millivolts is disposed across the ferroelectric element of said selected corresponding one of said cells and, in response to said voltage across said ferroelectric element, a current is provided to the control electrode of the selected transistor, and said fourth conductor provides a bias voltage to forward bias the selected transistor in said selected corresponding one of said cells to provide in response to the current to the control electrode an output current from the selected transistor, with said output current being indicative of the resistance of the ferroelectric element, the state of polarization of the ferroelectric element, and hence the logic state stored in the ferroelectric element.

\* \* \* \* \*